(12) United States Patent
Kang et al.

(10) Patent No.: US 7,923,735 B2
(45) Date of Patent: Apr. 12, 2011

(54) THIN FILM TRANSISTOR AND METHOD OF MANUFACTURING THE SAME

(75) Inventors: Ki-Nyeng Kang, Suwon-si (KR); Chul-Kyu Kang, Suwon-si (KR); Jong-Hyun Choi, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 12/461,193

(22) Filed: Aug. 4, 2009

(65) Prior Publication Data

US 2010/0176392 A1    Jul. 15, 2010

(30) Foreign Application Priority Data

Jan. 12, 2009    (KR) ..................... 10-2009-0002233

(51) Int. Cl.
*H01L 21/84* (2006.01)
*H01L 29/12* (2006.01)

(52) U.S. Cl. .................... 257/72; 257/43; 257/E21.411; 257/E29.296; 438/151

(58) Field of Classification Search .................... 257/43, 257/49, 52, 57, 61, 66, 72, E21.001, E21.002, 257/21.04, E21.085, E21.394, E21.4, E21.409, 257/E21.411, E29.001, E29.166, E29.169, 257/E29.226, E29.255, E29.273, E29.296; 438/142, 149–166

See application file for complete search history.

(56) References Cited

U.S. PATENT DOCUMENTS

2007/0103055 A1\*   5/2007   Tomai et al. .................. 313/503
2007/0252147 A1\*   11/2007   Kim et al. ........................ 257/59
2009/0166616 A1\*   7/2009   Uchiyama ........................ 257/43

FOREIGN PATENT DOCUMENTS

| JP | 2004-273614 A | 9/2004 |
| JP | 2007-250982 A | 9/2007 |
| JP | 2007-305658 A | 11/2007 |
| KR | 10-2007-0035373 A | 3/2007 |
| KR | 10-2008-0073944 A | 8/2008 |
| WO | WO 2007/108293 A1 | 9/2007 |

\* cited by examiner

*Primary Examiner* — Minh-Loan T Tran
*Assistant Examiner* — Kevin Quinto
(74) *Attorney, Agent, or Firm* — Lee & Morse, P.C.

(57) ABSTRACT

A TFT includes a substrate, a source electrode and a drain electrode on the substrate, the source and drain electrodes separated from each other, an active layer on the substrate between the source electrode and the drain electrode, a cladding unit on side surfaces of the source electrode and the drain electrode, a gate insulating layer on the substrate, the gate insulating layer overlapping the active layer and the cladding unit, and a gate electrode on the gate insulating layer, the gate electrode overlapping the active layer.

17 Claims, 4 Drawing Sheets

THIN FILM TRANSISTOR AND METHOD OF MANUFACTURING THE SAME

BACKGROUND OF THE INVENTION

1. Field of the Invention

Example embodiments relate to a thin film transistor (TFT), and more particularly, to an oxide TFT having a top gate structure and to a method of manufacturing the same.

2. Description of the Related Art

In an active matrix type flat panel display (FPD), e.g., a liquid crystal display (LCD), an organic light emitting display, etc., at least one TFT may be provided in each pixel.

The conventional TFT may include a channel region, an active layer that provides a source region and a drain region, and a gate electrode formed on the channel region to be electrically insulated from the active layer by a gate insulating layer. The active layer of the TFT may be formed of a semiconductor layer, e.g., amorphous silicon or polycrystalline silicon.

However, when the active layer is formed of the amorphous silicon, mobility may be low, so high speed operation of a driving circuit may be difficult to realize. On the other hand, when the active layer is formed of the polycrystalline silicon, while mobility may be high, a threshold voltage may be non-uniform due to the polycrystalline structure.

Further, a method of manufacturing the conventional TFT using low temperature poly-silicon (LTPS) may include an expensive price process, e.g., a laser heat treatment, which may be difficult to control. Therefore, it may be difficult to apply the conventional method to a large area substrate.

SUMMARY OF THE INVENTION

Example embodiments are therefore directed to a TFT and a method of manufacturing the same, which overcome the disadvantages and shortcomings of the related art.

It is therefore a feature of an example embodiment to provide a TFT having a cladding unit on side surfaces of source/drain electrodes thereof, so exposed source/drain electrodes may be prevented from being damaged.

It is another feature of an example embodiment to provide a method of manufacturing a TFT having a cladding unit on side surfaces of source/drain electrodes thereof.

At least one of the above and other features may be realized by providing a TFT, including a substrate, a source electrode and a drain electrode formed on the substrate to be separated from each other, an active layer formed in a region between the source electrode and the drain electrode, a cladding unit shaped to surround side surfaces of the source electrode and the drain electrode, a gate insulating layer formed on an entire surface including the active layer and the cladding unit, and a gate electrode formed on the gate insulating layer that overlaps with the active layer.

The active layer and the cladding unit may be formed of an oxide semiconductor layer. The oxide semiconductor layer may be formed of a GaInZnO (GIZO) layer mainly made of ZnO and doped with Ga and In. The oxide semiconductor layer may consist essentially of ZnO doped with Ga and In.

The source and drain electrodes may be formed to have a laminated structure of Ti/Al/Ti or Ti/Ag/Ti. A region of the gate insulating layer corresponding to a partial region of the drain electrode may be etched so that the partial region of the drain electrode is exposed and the gate electrode material is formed in the etched region.

The cladding unit may cover an outer side surface of each of the source and drain electrodes, the outer side surfaces of the source and drain electrodes facing away from a channel region of the active layer. The cladding unit may cover an entire outer side surface of each of the source and drain electrodes. The cladding unit may cover at least two surfaces of each of the source and drain electrodes. The cladding unit may be spaced apart from the active layer. The cladding unit may surround the side surfaces of the source electrode and the drain electrode.

At least one of the above and other features may be realized by providing a method of manufacturing a TFT, including forming a source electrode and a drain electrode on a substrate to be separated from each other, forming an active layer in a region between the source electrode and the drain electrode and forming a cladding unit on side surfaces of the source electrode and the drain electrode to surround the side surfaces of the source electrode and the drain electrode, forming a gate insulating layer on an entire surface including the active layer and the cladding unit, and forming a gate electrode on the gate insulating layer that overlaps with the active layer. The active layer and the cladding unit may be formed simultaneously. The oxide semiconductor layer may be formed to cover all exposed surfaces of the source and drain electrodes and a region between the source and drain electrodes, and the oxide semiconductor layer may be etched to form the active layer and the cladding unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1A:
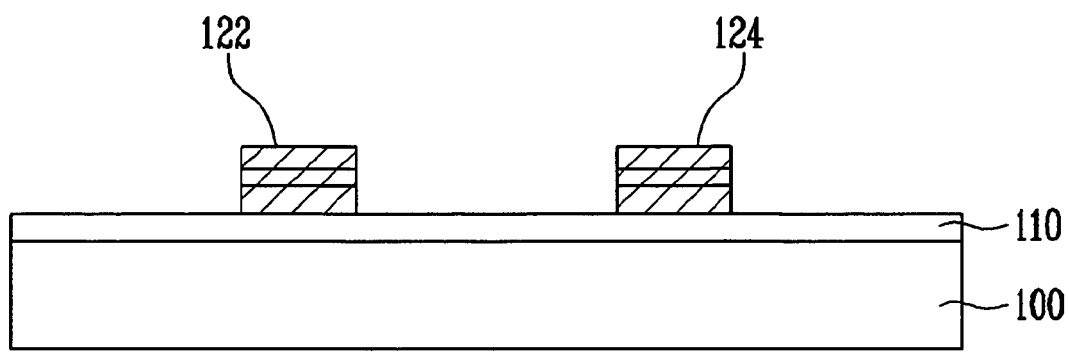
FIGS. 1A to 1D illustrate cross-sectional views of sequential processes in a method of manufacturing a TFT according to an example embodiment.

Korean Patent Application No. 10-2009-0002233, filed on Jan. 12, 2009, in the Korean Intellectual Property Office, and entitled: "Thin Film Transistor and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements, layers, and regions may be exaggerated for clarity of illustration. It will also be understood that when a layer or element is referred to as being "on" another layer or substrate, it can be directly on the other layer or substrate, or intervening layers may also be present. Further, it will be understood that when a layer or element is referred to as being "connected to" another layer or element, it can be directly connected to the layer or element, or intervening layers or elements may be interposed therebetween. In addition, it will also be understood that when a layer or element is referred to as being "between" two layers or elements, it can be the only layer or element between the two layers or elements, or one or more intervening layers or element may also be present. Like reference numerals refer to like elements throughout.

As used herein, the terms "a" and "an" are open terms that may be used in conjunction with singular items or with plural items.

Hereinafter, example embodiments of the present invention will be described in detail with reference to the accompanying drawings.

FIGS. 1A to 1D illustrate cross-sectional views of sequential processes in a method of manufacturing a TFT according to an example embodiment.

First, referring to FIG. 1A, in the TFT, a buffer layer 110 may be formed on a substrate 100. Source/drain electrodes 122 and 124 may be formed on the buffer layer 110.

For example, the source/drain electrodes 122 and 124 may be formed to have a three-layer structure, e.g., Ti/Al/Ti, so that the source/drain electrodes 122 and 124 may have low resistance.

The source/drain electrodes 122 and 124 may be formed to correspond to a shape of a predetermined pattern by performing exposing, developing, and etching processes after sequentially depositing the Ti/Al/Ti metals on the buffer layer 110.

Figure 1B:
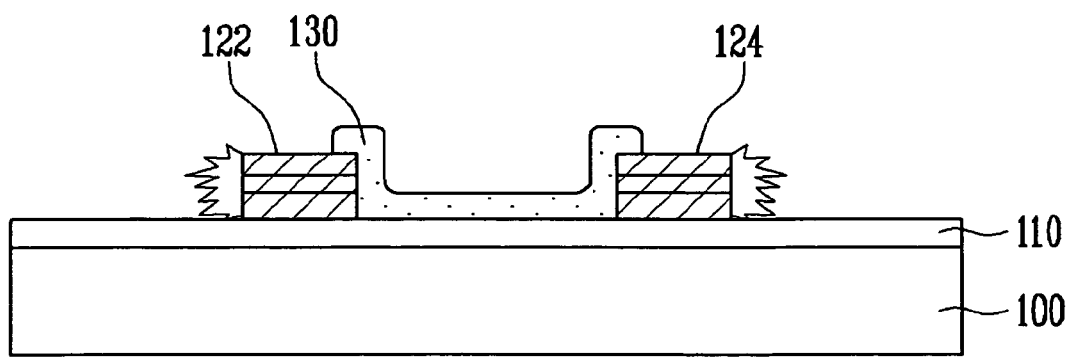

Then, as illustrated in FIG. 1B, an active layer 130 that provides a channel region may be formed in the predetermined space between the source and drain electrodes 122 and 124. The active layer 130 may include an oxide semiconductor layer formed, e.g., of a GaInZnO (GIZO) layer mainly made of ZnO and doped with Ga and In. For example, the oxide semiconductor layer of the active layer 130 may consist essentially of ZnO doped with Ga and In.

That is, the TFT according to the example embodiment may be characterized in that the active layer 130 may be formed of an oxide semiconductor layer, i.e., oxide semiconductor made of ZnO. The oxide semiconductor may be an amorphous layer formed of a stable material. In addition, when the active layer 130 includes the oxide semiconductor layer, the TFT may be manufactured at a low temperature, e.g., at about 350° C. or less, using conventional process equipment without purchasing additional process equipment and an ion injecting process may be omitted.

The active layer 130 may be formed to have the shape of the predetermined space between the source electrode 122 and the drain electrode 124, as illustrated in FIG. 1B. That is, exposure, development, and etching processes may be performed, after depositing the GIZO material on the entire surface of the substrate 100 to cover the source/drain electrodes 122 and 124, so the active layer 130 may be between the source and drain electrodes 122 and 124. For example, as illustrated in FIG. 1B, portions of the deposited GIZO material may be removed so that the active layer 130 may overlap only a small portion of an upper surface of each of the drain and source electrodes 122 and 124.

However, in this case, the source/drain electrodes 122 and 124 may have low resistance, e.g., may be formed of the Ti/Al/Ti, as described above. When an etching process is performed so that the oxide semiconductor layer 130 is formed in the shape of the pattern illustrated in FIG. 1B, an exposed Al metal in the side surfaces of the source/drain electrodes 122 and 124 may be damaged or oxidized, as further illustrated in FIG. 1B.

Figure 1C:
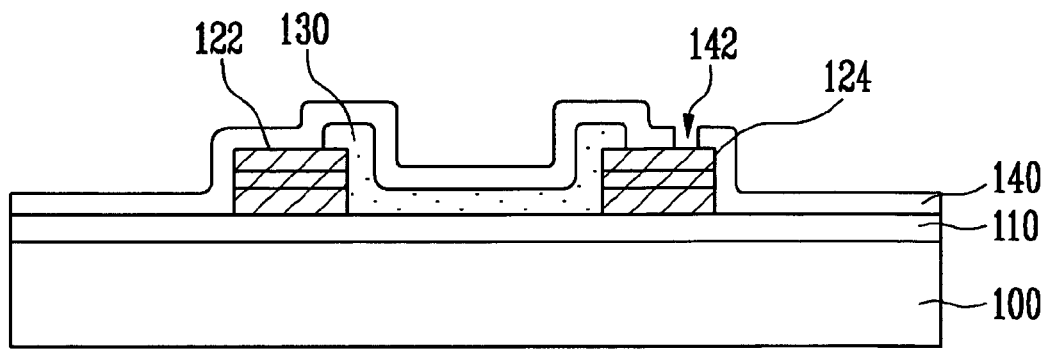

Then, referring to FIG. 1C, a gate insulating layer 140 may be formed on the entire surface of the substrate 100 where the active layer 130 is formed. In the embodiment, a partial region 142 of the gate insulating layer 140 corresponding to the drain electrode 124 may be etched, so that a portion of the drain electrode 124 may be exposed via the partial region 142.

Figure 1D:
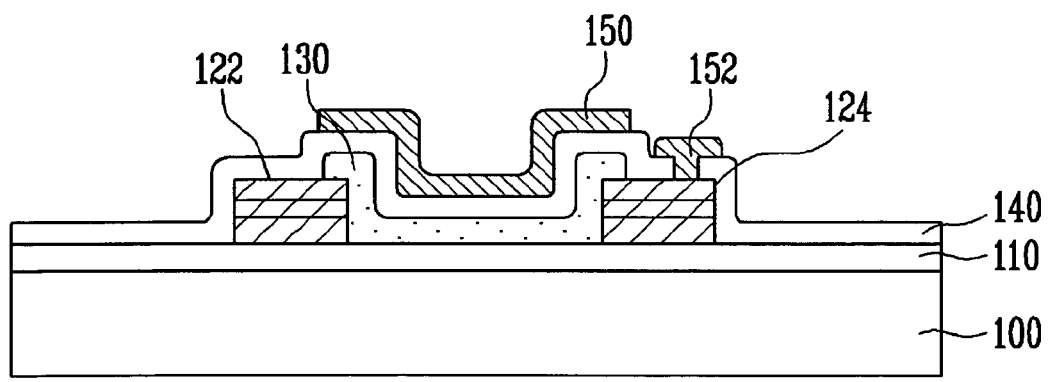

Referring to FIG. 1D, a gate electrode 150 may be formed on the gate insulating layer 140 to overlap the active layer 130. A gate metal 152, e.g., a metal plug, that realizes the gate electrode 150 may be formed in the partial region 142 of the gate insulating layer 140.

The oxide TFT having the top gate structure may be manufactured by the above-described processes. When the TFT is provided in a pixel circuit of a display, e.g., a LCD or an organic light emitting display, the gate metal 152 electrically coupled to the drain electrode 124 may be coupled to a pixel electrode or an organic light emitting element of the display.

However, according to the first embodiment, the side surfaces of the source/drain electrodes 122 and 124 may be exposed during an etching process for forming the active layer 130 pattern, so that the oxide evaporation material is damaged or oxidized. Therefore, the performance of the TFT may deteriorate or characteristics of the TFT may change.

Another example embodiment will be described hereinafter with respect to FIGS. 2A-2D, which may further reduce or prevent damage/oxidation to the side surfaces of the source/drain electrodes during etching. FIGS. 2A to 2D illustrate cross-sectional views of sequential processes of a method of manufacturing a TFT according to the other example embodiment. The same elements as the elements according to the first embodiment illustrated in FIGS. 1A to 1D are denoted by the same reference numerals.

Figure 2A:
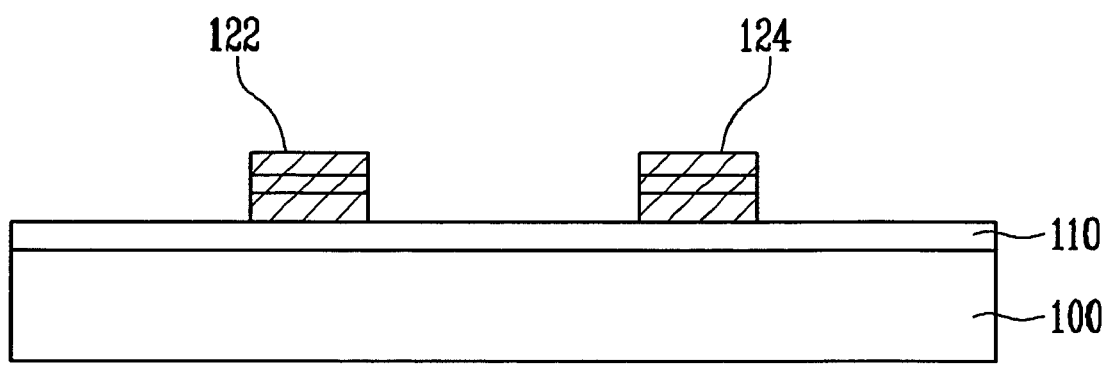
FIGS. 2A to 2D illustrate cross-sectional views of sequential processes in a method of manufacturing a TFT according to another example embodiment.

First, referring to FIG. 2A, the buffer layer 110 may be formed on the substrate 100 and source/drain electrodes 122 and 124 may be formed on the buffer layer 110. At this time, the source/drain electrodes 122 and 124 may be formed to have the three-layer structure of Ti/Al/Ti. For example, after deposition of the Ti/Al/Ti on the buffer layer 110, the deposited Ti/Al/Ti layers may be etched to form the source/drain electrodes 122 and 124 spaced apart from each other with a predetermined space therebetween, as illustrated in FIG. 2A.

However, the above is only an example embodiment and other configurations of the source/drain electrodes 122 and 124 are within the scope of embodiments. For example, the source/drain electrodes 122 and 124 may include a metal material having a laminated structure so that the source/drain electrodes 122 and 124 may have low resistance, e.g., the Al may be replaced with Ag.

Figure 2B:
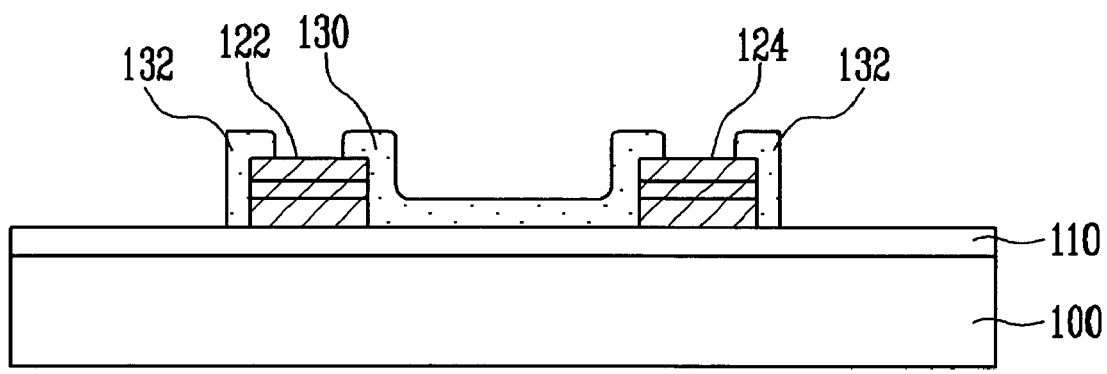

Then, as illustrated in FIG. 2B, the active layer 130 may be formed to provide a channel region between the source and drain electrodes 122 and 124. Further, as illustrated in FIG. 2B, a cladding unit 132 that covers side surfaces of the source/drain electrodes 122 and 124 may be formed on portions of the source and drain electrodes 122 and 124.

The active layer 130 and the cladding unit 132 may be formed of an oxide semiconductor layer, e.g., a GIZO layer. That is, the active layer 130 and the cladding unit 132 may include mainly ZnO doped with Ga and In. For example, the active layer 130 may consist essentially of ZnO doped with Ga and In.

That is, the TFT according to the example embodiment may include the active layer 130 as an oxide semiconductor layer on the substrate 100, e.g., directly on the buffer layer 110, between the source and drain electrodes 122 and 124, and the cladding unit 132 on each of the source and drain electrodes 122 and 124. The cladding unit 132 may be shaped to cover the side surfaces of the source/drain electrodes 122 and 124, so the side surfaces of the source/drain electrodes 122 and 124 may be protected from exposure and damage during manufacturing, e.g., during the etching process performed during formation of the oxide semiconductor layer 130.

For example, GIZO material may be deposited on the entire surface of the substrate 100, so all exposed surfaces of the buffer 110 and source/drain electrodes 122 and 124 may be covered therewith. In other words, the GIZO material may at least cover the buffer layer 110 between the source/drain electrodes 122 and 124, and may cover upper and side surfaces of each of the source/drain electrodes 122 and 124, e.g., entire upper and side surfaces of each of the source/drain electrodes 122 and 124. In this respect, it is noted the upper surfaces of the source/drain electrodes 122 and 124 refer to surfaces that include at least one point tangent to a plane substantially parallel to the substrate 100. Further, the side surfaces of the source/drain electrodes 122 and 124 may extend from the buffer layer 110 toward the upper surfaces.

Once the GIZO material is deposited, the GIZO material may be patterned to form the active layer 130 and the cladding unit 132, e.g., simultaneously, in a shape of the pattern positioned in the space between the source electrode 122 and the drain electrode 124. The cladding unit 132 may be formed to cover the side surfaces of the source/drain electrodes 122 and 124, as illustrated in FIG. 2B, by performing exposing, developing, and etching. For example, the cladding unit 132 may surround side surfaces of the source/drain electrodes 122 and 124. In another example, the cladding unit 132 may be on, e.g., directly on, outer surfaces of the source/drain electrodes 122 and 124, i.e., external surfaces of the source/drain electrodes 122 and 124 facing away from the channel region of the active layer 130. As further illustrated in FIG. 2B, the active layer 130 and the cladding unit 132 may be patterned to be spaced apart from each other to expose a portion of the upper surface of each of the source and drain electrodes 122 and 124.

Therefore, in the three-layer structured source/drain electrodes 122 and 124, if the metal layer between the Ti layers is unstable, the cladding unit 132 may protect the metal layer. For example, if an Al layer is formed between the Ti layers of the source and drain electrodes 122 and 124, the cladding unit 132 on the side surfaces of the source and drain electrodes 122 and 124 may protect the Al layer during processing. Accordingly, side surfaces of the source/drain electrodes 122 and 124 may not be exposed during processing of an oxide semiconductor layer, e.g., etching, to form the active layer 130, so Al may not be damaged or oxidized as an oxide evaporates during processing. Therefore, good performance of the TFT may be maintained, i.e., deterioration or change of the characteristics of the TFT may be prevented or substantially minimized.

Figure 2C:
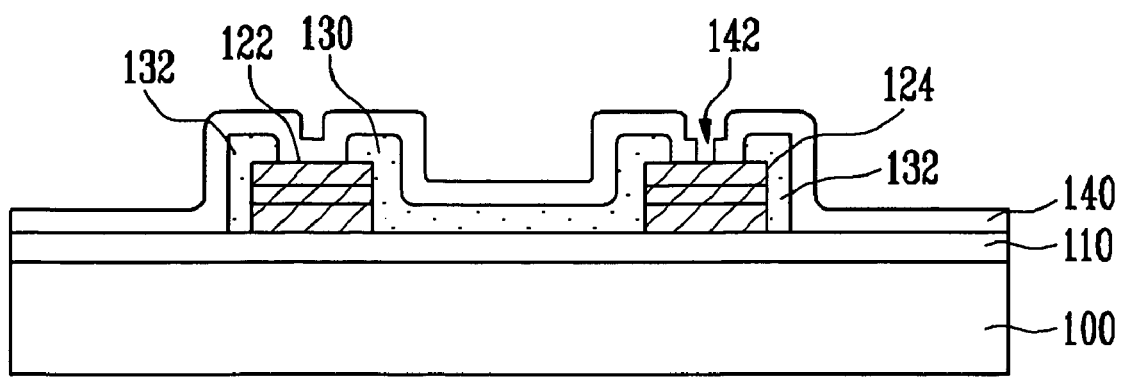

Then, referring to FIG. 2C, the gate insulating layer 140 may be formed on the entire substrate 100 where the active layer 130 and the cladding unit 132 are formed. For example, the gate insulating layer 140 may be formed on, e.g., directly on, the active layer 130 and cladding unit 132, and may be formed on, e.g., directly on, the exposed upper surface of each of the source and drain electrodes 122 and 124, i.e., between the active layer 130 and the cladding unit 132. According to the embodiment, the partial region 142 of the gate insulating layer 140 corresponding to the drain electrode 124 may be etched through the gate insulating layer 140 and between the active layer 130 and the cladding unit 132 to expose a portion of the upper surface of the drain electrode 124, as illustrated in FIG. 2C.

Figure 2D:
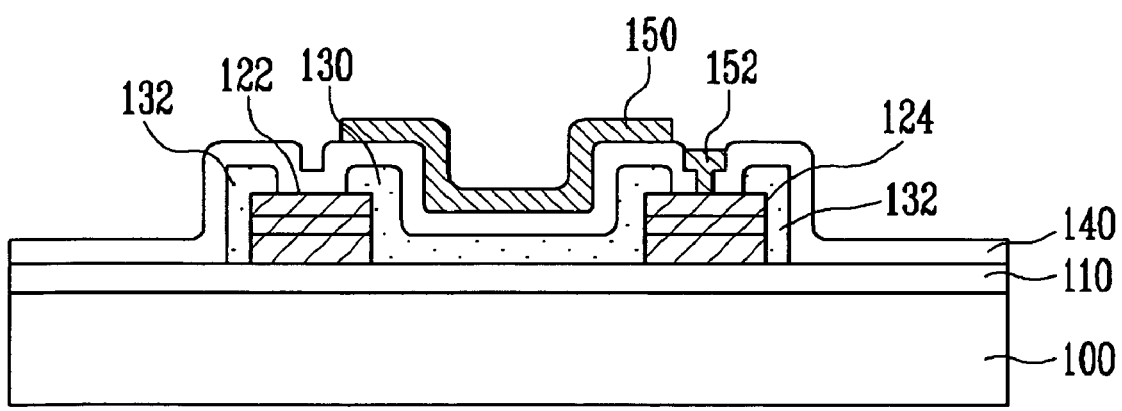

Referring to FIG. 2D, the gate electrode 150 may be formed on the gate insulating layer 140, so the gate electrode 150 may overlap the active layer 130. The gate metal 152 that realizes the gate electrode 150 may be formed in the partial region 142 of the gate insulating layer 140. The gate metal 152 and the gate electrodes 150 may be formed of a substantially same material.

The oxide TFT according to example embodiments may have a top gate structure and may be manufactured by the above-described processes. When the TFT is provided in a pixel circuit of a display device, e.g., LCD or an organic light emitting display, the gate metal 152 electrically coupled to the drain electrode 124 may be coupled to a pixel electrode or an organic light emitting element of the display device.

According to example embodiments, the cladding unit made of the oxide semiconductor layer may be formed on the side surfaces of the source/drain metals of the oxide TFT having the top gate structure. Therefore, it may be possible to reduce or prevent oxidation of exposed source/drain metals when the oxide semiconductor layer used as the active layer is etched, so that the source/drain metals having low resistance may be protected.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film transistor (TFT), comprising:
   a substrate;
   a source electrode and a drain electrode on the substrate, the source and drain electrodes separated from each other;
   an active layer on the substrate between the source electrode and the drain electrode;
   a cladding unit on side surfaces of the source electrode and the drain electrode, the cladding unit being spaced apart from the active layer;
   a gate insulating layer on the substrate, the gate insulating layer overlapping the active layer and the cladding unit; and
   a gate electrode on the gate insulating layer, the gate electrode overlapping the active layer.

2. The TFT as claimed in claim 1, wherein each of the source and drain electrodes includes a laminated structures of Ti/Al/Ti or Ti/Ag/Ti.

3. The TFT as claimed in claim 1, wherein the gate insulating layer includes an opening exposing the drain electrode, the opening including a metal plug having a substantially same material as the gate electrode.

4. The TFT as claimed in claim 1, wherein the cladding unit surrounds the side surfaces of the source electrode and the drain electrode.

5. The TFT as claimed in claim 1, wherein the active layer and the cladding unit include an oxide semiconductor layer.

6. The TFF as claimed in claim 5, wherein the oxide semiconductor layer includes a GaInZnO (GIZO) layer, the GIZO layer including ZnO doped with Ga and In.

7. The TFF as claimed in claim 6, wherein the oxide semiconductor layer consists essentially of ZnO doped with Ga and In.

8. The TFT as claimed in claim 1, wherein the cladding unit covers an outer side surface of each of the source and drain electrodes, the outer side surfaces of the source and drain electrodes facing away from a channel region of the active layer.

9. The TFT as claimed in claim 8, wherein the cladding unit covers an entire outer side surface of each of the source and drain electrodes.

10. The TFT as claimed in claim 8, wherein the cladding unit covers at least two surfaces of each of the source and drain electrodes.

11. A method of manufacturing a thin film transistor, comprising:
- forming a source electrode and a drain electrode on a substrate, the source and drain electrodes being separated from each other;
- forming an active layer on the substrate between the source electrode and the drain electrode;
- forming a cladding unit on side surfaces of the source electrode and the drain electrode;
- forming a gate insulating layer on the substrate, the gate insulating layer overlapping the active layer and the cladding unit;
- etching a region of the gate insulating layer corresponding to the drain electrode, such that a portion of the drain electrode is exposed;
- forming a gate electrode on the gate insulating layer, the gate electrode overlapping the active layer; and
- depositing metal in the etched region, the metal being a substantially same metal used to form the gate electrode.

12. The method as claimed in claim 11, wherein the source and drain electrodes are formed to have a laminated structure of Ti/Al/Ti or Ti/Ag/Ti.

13. The method as claimed in claim 11, wherein the active layer and the cladding unit are formed of an oxide semiconductor layer.

14. The method as claimed in claim 13, wherein the oxide semiconductor layer is formed of a GaInZnO (GIZO), the GIZO being formed of ZnO and doped with Ga and In.

15. The method as claimed in claim 13, wherein the active layer and the cladding unit are formed simultaneously.

16. The method as claimed in claim 13, wherein:
- the oxide semiconductor layer is formed to cover all exposed surfaces of the source and drain electrodes and a region between the source and drain electrodes; and
- the oxide semiconductor layer is etched to form the active layer and the cladding unit.

17. A method of manufacturing a thin film transistor, comprising:
- forming a source electrode and a drain electrode on a substrate, the source and drain electrodes being separated from each other;
- forming an active layer on the substrate between the source electrode and the drain electrode, and forming a cladding unit on side surfaces of the source electrode and the drain electrode,
- patterning the cladding unit to be spaced apart from the active layer;
- forming a gate insulating layer on the substrate, the gate insulating layer overlapping the active layer and the cladding unit; and
- forming a gate electrode on the gate insulating layer, the gate electrode overlapping the active layer.

* * * * *